(12) United States Patent
Qiu et al.

(10) Patent No.: US 11,588,006 B2
(45) Date of Patent: Feb. 21, 2023

(54) DISPLAYING BACKPLANE AND FABRICATING METHOD THEREOF, AND DISPLAYING DEVICE

(71) Applicants: Chengdu BOE Optoelectronics Technology Co., Ltd., Chengdu (CN); BOE Technology Group Co., Ltd., Beijing (CN)

(72) Inventors: Yuanyou Qiu, Beijing (CN); Yao Huang, Beijing (CN); Weiyun Huang, Beijing (CN); Binyan Wang, Beijing (CN); Cong Liu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 150 days.

(21) Appl. No.: 17/348,649

(22) Filed: Jun. 15, 2021

(65) Prior Publication Data
US 2022/0102465 A1 Mar. 31, 2022

(30) Foreign Application Priority Data
Sep. 25, 2020 (CN) .......................... 202011025008.5

(51) Int. Cl.
*H01L 27/32* (2006.01)
*H01L 51/56* (2006.01)

(52) U.S. Cl.
CPC ........ *H01L 27/3276* (2013.01); *H01L 27/326* (2013.01); *H01L 27/3234* (2013.01); *H01L 51/56* (2013.01); *H01L 2227/323* (2013.01)

(58) Field of Classification Search
CPC .................................................. H01L 27/3276
See application file for complete search history.

(56) References Cited

U.S. PATENT DOCUMENTS

| | | | | |
|---|---|---|---|---|
| 2018/0261797 A1* | 9/2018 | Lee | ...................... | H01L 27/3218 |
| 2019/0393286 A1* | 12/2019 | Ding | ................... | H01L 27/3246 |
| 2021/0320164 A1* | 10/2021 | Lee | ...................... | H01L 27/3276 |
| 2021/0376047 A1* | 12/2021 | Xue | ...................... | H01L 27/3276 |
| 2021/0408191 A1* | 12/2021 | Zhao | ................... | H01L 27/3248 |
| 2022/0045155 A1* | 2/2022 | Ma | ....................... | H01L 27/3276 |

\* cited by examiner

*Primary Examiner* — Douglas M Menz
(74) *Attorney, Agent, or Firm* — IPRO, PLLC (57) ABSTRACT

A displaying region of a displaying backplane is delimited into a first displaying region and a second displaying region, the light transmittance of the first displaying region is less than that of the second displaying region, the displaying backplane has a metal signal line in a trace region, a plurality of sub-pixels located within the first displaying region are connected to a common cathode, and the common cathode is connected to the metal signal line. At least some of the sub-pixels located within the second displaying region are connected to independent cathodes, the independent cathodes are separate from each other, the displaying backplane further includes a first electrically conductive layer, and the independent cathodes are connected to the metal signal line via the first electrically conductive layer. The first electrically conductive layer is a planar electrode, and the orthographic projection of the planar electrode covers the second displaying region.

15 Claims, 7 Drawing Sheets

```
┌─────────────────────────────────────────────────────────────┐
│  forming the plurality of sub-pixels, the metal signal line │──── S100
│       and the first electrically conductive layer           │
└─────────────────────────────────────────────────────────────┘
                              │
                              ▼
┌─────────────────────────────────────────────────────────────┐
│     forming the common cathode and the independent          │──── S200
│      cathodes, to obtain the displaying backplane           │
└─────────────────────────────────────────────────────────────┘
```

Fig. 12

```
┌─────────────────────────────────────────────────────────────┐
│  forming the plurality of sub-pixels, the metal signal line │──── S100
│       and the first electrically conductive layer           │
└─────────────────────────────────────────────────────────────┘
                              │
                              ▼
┌─────────────────────────────────────────────────────────────┐
│   forming a second electrically conductive layer on one     │
│   side of the first electrically conductive layer that is   │──── S300
│         further away from the substrate base plate          │
└─────────────────────────────────────────────────────────────┘
                              │
                              ▼
┌─────────────────────────────────────────────────────────────┐
│     forming the common cathode and the independent          │──── S200
│      cathodes, to obtain the displaying backplane           │
└─────────────────────────────────────────────────────────────┘
```

Fig. 13

DISPLAYING BACKPLANE AND FABRICATING METHOD THEREOF, AND DISPLAYING DEVICE

CROSS REFERENCE TO RELEVANT APPLICATIONS

The present disclosure claims the priority of the Chinese patent application filed on Sep. 25, 2020 before the Chinese Patent Office with the application number of 202011025008.5 and the title of "DISPLAYING BACKPLANE AND FABRICATING METHOD THEREOF, AND DISPLAYING DEVICE", which is incorporated herein in its entirety by reference.

TECHNICAL FIELD

The present disclosure relates to the technical field of displaying, and particularly relates to a displaying backplane and a fabricating method thereof, and a displaying device.

BACKGROUND

In the related art, in OLED displaying devices having a full screen, in order to increase the light transmittance within the image acquisition region (for example, the camera region and so on) of the OLED displaying devices to the largest extent, to realize a good effect of image acquisition, usually the cathodes of the light emitting elements within the image acquisition region in the OLED displaying devices are patterned.

SUMMARY

The present disclosure provides a displaying backplane and a fabricating method thereof, and a displaying device.

In an aspect of the present disclosure, the present disclosure provides a displaying backplane. According to an embodiment of the present disclosure, a displaying region of the displaying backplane is delimited into a first displaying region and a second displaying region, a light transmittance of the first displaying region is less than a light transmittance of the second displaying region, and the displaying backplane has a metal signal line in a trace region, wherein a plurality of sub-pixels located within the first displaying region are connected to a common cathode, and the common cathode is connected to the metal signal line;

at least some of the plurality of sub-pixels located within the second displaying region are connected to independent cathodes, a plurality of the independent cathodes within the second displaying region are separate from each other, the displaying backplane further comprises a first electrically conductive layer, and the independent cathodes are connected to the metal signal line via the first electrically conductive layer; and the first electrically conductive layer is a planar electrode, and an orthographic projection of the planar electrode on a substrate base plate covers the second displaying region; or the first electrically conductive layer has a plurality of electrically conductive traces, and the plurality of electrically conductive traces are connected to the common cathode.

According to an embodiment of the present disclosure, the planar electrode is connected to the common cathode.

According to an embodiment of the present disclosure, the displaying backplane further comprises: a connecting metal, wherein the connecting metal and an anode of a light emitting diode of the displaying backplane are provided in a same one layer, and the connecting metal is connected to the first electrically conductive layer and the independent cathodes.

According to an embodiment of the present disclosure, the plurality of electrically conductive traces are provided parallel to each other and have a direction of extension parallel to a direction of extension of the metal signal line.

According to an embodiment of the present disclosure, the plurality of electrically conductive traces are provided parallel to each other and have a direction of extension perpendicular to a direction of extension of the metal signal line.

According to an embodiment of the present disclosure, the plurality of electrically conductive traces are arranged in a first direction and a second direction, the first direction and the second direction have an included angle therebetween, the first direction is a direction of extension of the metal signal line, each of the electrically conductive traces extending in the second direction has one end connected to the metal signal line, and an other end connected to the common cathode, and both of two ends of each of the electrically conductive traces extending in the first direction are connected to the common cathode.

According to an embodiment of the present disclosure, the displaying backplane further comprises: a second electrically conductive layer, wherein the second electrically conductive layer is provided on one side of the first electrically conductive layer that is further away from the substrate base plate, and the second electrically conductive layer is connected to the independent cathodes and the metal signal line.

According to an embodiment of the present disclosure, the metal signal line is a VSS signal line.

According to an embodiment of the present disclosure, the first electrically conductive layer is connected to the independent cathodes and the metal signal line by at least one of a via hole and a groove.

According to an embodiment of the present disclosure, the via hole and the groove are formed in an insulating layer.

According to an embodiment of the present disclosure, the displaying backplane further comprises:

a first insulating layer, wherein the first insulating layer is provided on one side of the substrate base plate; and a light-emission controlling layer, wherein the light-emission controlling layer is electrically connected to an anode of a light emitting diode in the displaying backplane and a source-drain electrode of a thin-film transistor for controlling light emission in the displaying backplane, and the light-emission controlling layer is provided on part of a surface of the first insulating layer.

According to an embodiment of the present disclosure, the displaying backplane further comprises:

a second insulating layer, wherein the second insulating layer is provided on surfaces of the light-emission controlling layer and the first insulating layer that are further away from the substrate base plate; and the first electrically conductive layer is provided on one surface of the second insulating layer that is further away from the substrate base plate.

In another aspect of the present disclosure, the present disclosure provides a method for fabricating the displaying backplane stated above. According to an embodiment of the present disclosure, the method comprises: forming the plurality of sub-pixels, the metal signal line and the first electrically conductive layer; and forming the common cathode and the independent cathodes, to obtain the displaying backplane.

According to an embodiment of the present disclosure, before the step of forming the common cathode and the independent cathodes, the method further comprises:

forming a second electrically conductive layer on one side of the first electrically conductive layer that is further away from the substrate base plate.

In yet another aspect of the present disclosure, the present disclosure provides a displaying device. According to an embodiment of the present disclosure, the displaying device comprises the displaying backplane stated above.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

The embodiments of the present disclosure will be described in detail below. The embodiments described below are exemplary, are merely intended to interpret the present disclosure, and should not be construed as a limitation on the present disclosure. Where an embodiment is not explicitly provided with the particular techniques or conditions, the embodiment is implemented by using the techniques or conditions described in documents in the art or according to a product specification.

Figure 1:
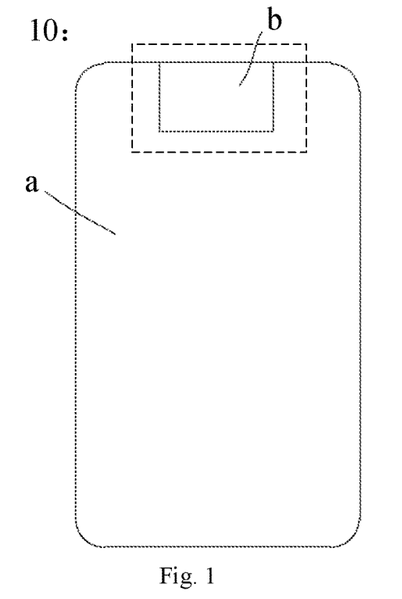
FIG. 1 shows a schematic planar structural diagram of the displaying backplane according to an embodiment of the present disclosure.
Figure 2:
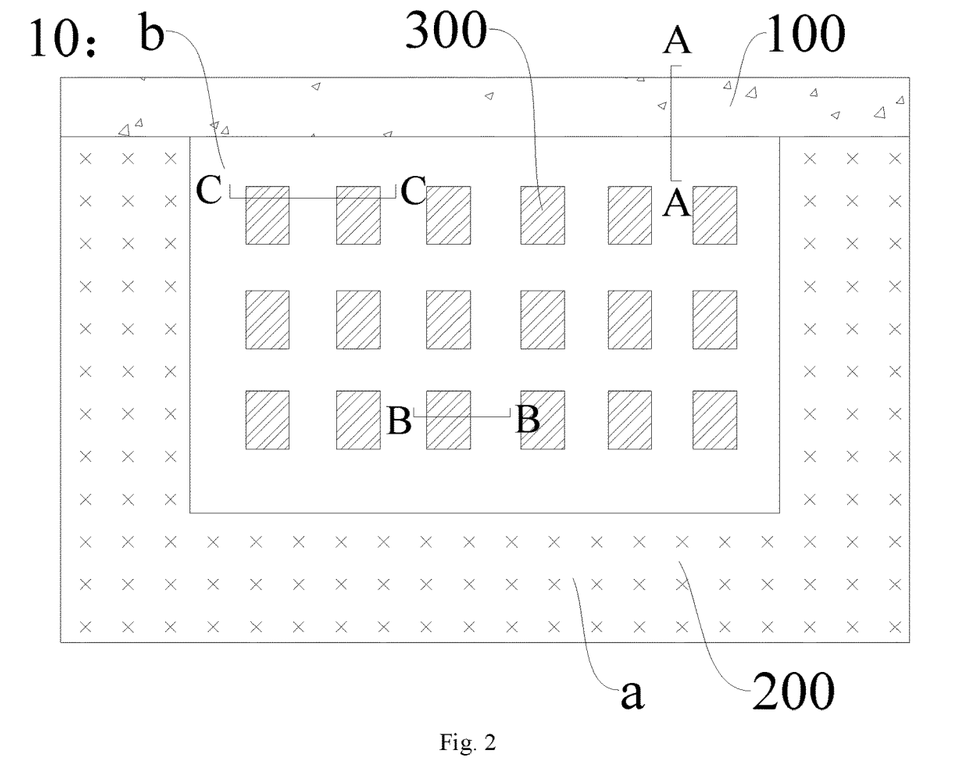
FIG. 2 shows a schematic planar structural diagram of the displaying backplane according to another embodiment of the present disclosure.
Figure 3:
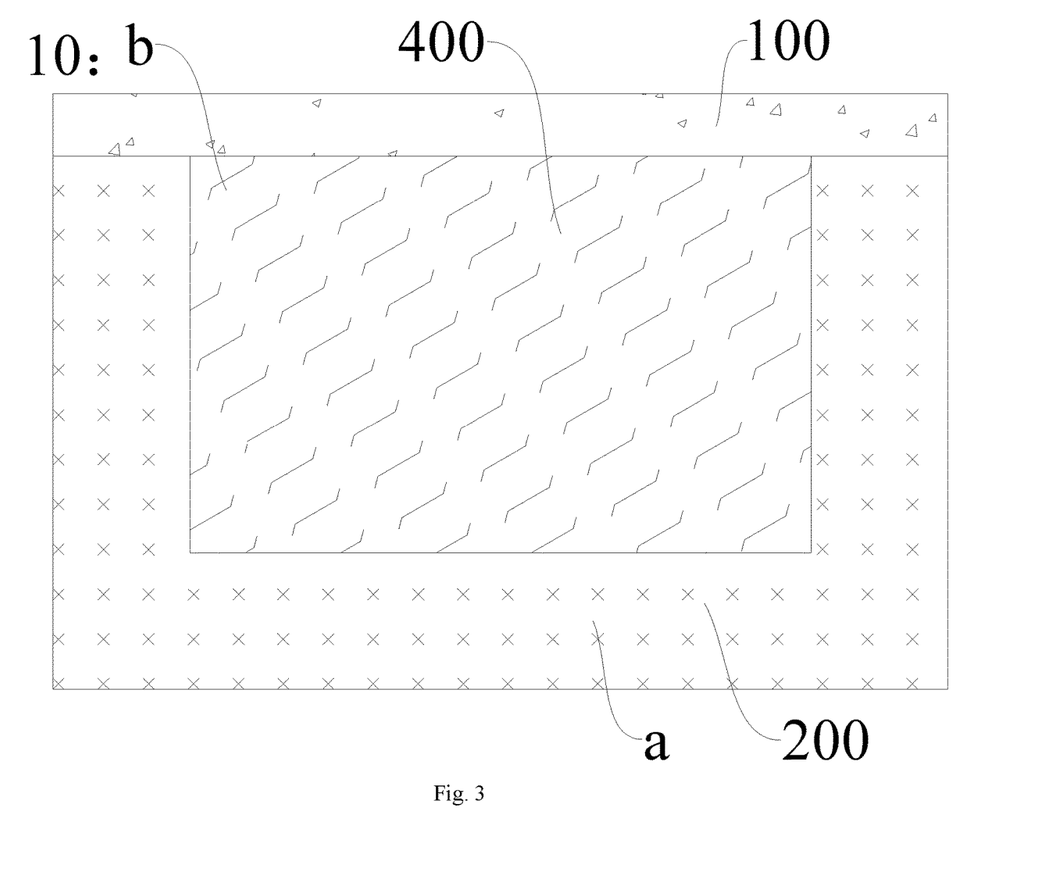
FIG. 3 shows a schematic planar structural diagram of the displaying backplane according to yet another embodiment of the present disclosure.

In an aspect of the present disclosure, the present disclosure provides a displaying backplane. According to an embodiment of the present disclosure, referring to FIG. 1, the displaying region of the displaying backplane 10 is delimited into a first displaying region a and a second displaying region b, and the light transmittance of the first displaying region a is less than the light transmittance of the second displaying region b. Referring to FIG. 2, the displaying backplane 10 has a metal signal line 100 at a trace region (not shown in the figure), a plurality of sub-pixels located within the first displaying region a are connected to a common cathode 200, and the common cathode 200 is connected to the metal signal line 100; and at least some of the plurality of sub-pixels located within the second displaying region b are connected to independent cathodes 300, a plurality of independent cathodes 300 within the second displaying region b are separate from each other, and the displaying backplane 10 further comprises a first electrically conductive layer 400 (referring to FIG. 3 for the schematic structural diagram). Referring to FIGS. 2 and 3, the independent cathodes 300 are connected to the metal signal line 100 via the first electrically conductive layer 400. Particularly, the first electrically conductive layer 400 may be a planar electrode (referring to FIG. 3 for the schematic structural diagram), the orthographic projection of the planar electrode on the substrate base plate covers the second displaying region b; or, alternatively, the first electrically conductive layer may have a plurality of electrically conductive traces 410 (referring to FIG. 4, 5 or 6 for the schematic structural diagram), and the plurality of electrically conductive traces 410 are connected to the common cathode 200. By using the mode of the provision of the independent cathodes 300 stated above, the plurality of sub-pixels within the second displaying region b can realize the displaying function, and, at the same time, can also realize the function of image acquisition (for example, photographing, shooting and so on), thereby realizing full-screen displaying. What is more important is that, because the independent cathodes 300 in the displaying backplane 10 are connected to the metal signal line 100 via the first electrically conductive layer 400, when the first electrically conductive layer 400 is a planar electrode, the signal of the metal signal line 100 can directly flow into the independent cathodes 300 via the planar electrode, and when the first electrically conductive layer has a plurality of electrically conductive traces 410, the signal of the metal signal line 10 cannot only directly flow into the independent cathodes 300 (referring to FIG. 5 or 6), but can also flow into the independent cathodes 300 via the common cathode 200 (referring to FIG. 4). In all of those three modes of the signal of the metal signal line 100 flowing into the independent cathodes 300, the electric-current signal does not require to flow through a large load, which can enable the independent cathodes 300 within the second displaying region to have a low voltage drop, to obtain a good effect of displaying.

According to an embodiment of the present disclosure, a person skilled in the art can understand that the shapes of the first displaying region a and the second displaying region b are not particularly limited, and their shapes are not limited to a quadrangle; for example, they may also be a circle, a triangle and so on. The positions of the second displaying region b and the first displaying region a are not particularly limited, and their edges may contact, and may also not contact, which is not discussed here in further detail.

According to an embodiment of the present disclosure, optionally, the planar electrode stated above is not only connected to the metal signal line 100, but may also be connected to the common cathode 200 stated above. By using such a mode of configuration, when the independent cathodes 300 located within the second displaying region b are receiving the electric-current signal flowing out of the metal signal line 100, the electric-current signal cannot only directly flow into the independent cathodes 300 via the planar electrode, but also the electric-current signal can firstly be transmitted to the common cathode 200, subsequently be transmitted to the planar electrode, and finally reach the independent cathodes 300. Accordingly, the independent cathodes 300 can receive the electric-current signal emitted by the metal signal line 100 in multiple different directions and via multiple different accesses, whereby the independent cathodes 300 receive the electric-current signal of the metal signal line 100 more stably, with a lower voltage drop, and the displaying backplane 10 has a better effect of displaying and a higher stability.

Figure 4:
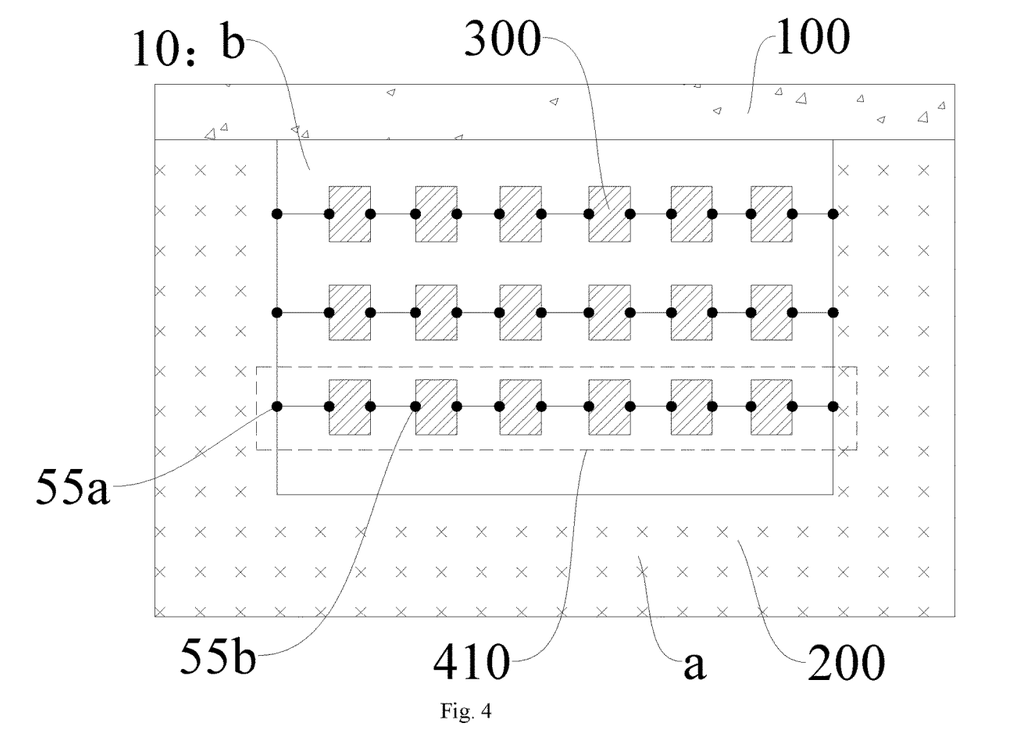
FIG. 4 shows a schematic planar structural diagram of the displaying backplane according to still another embodiment of the present disclosure.
Figure 5:
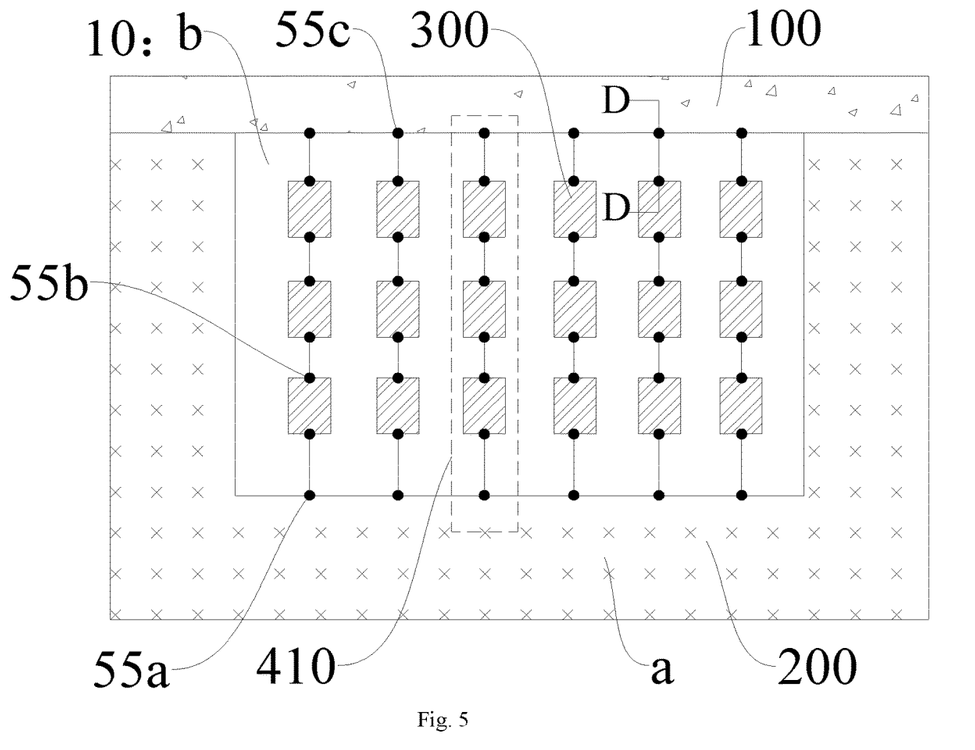
FIG. 5 shows a schematic planar structural diagram of the displaying backplane according to still another embodiment of the present disclosure.
Figure 6:
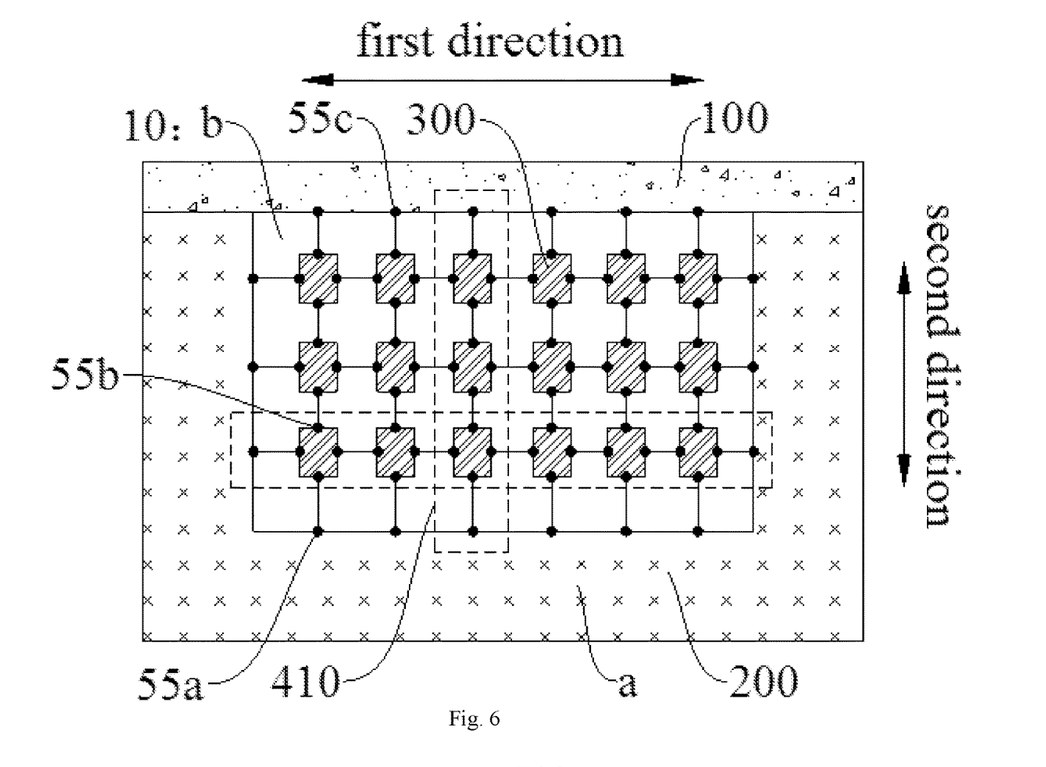
FIG. 6 shows a schematic planar structural diagram of the displaying backplane according to still another embodiment of the present disclosure.
Figure 7:
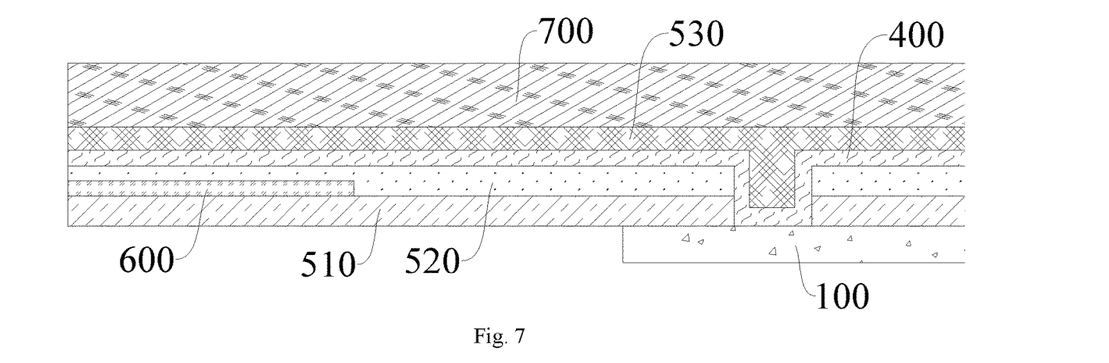
FIG. 7 shows a schematic sectional structural diagram along the line AA of the displaying backplane in FIG. 2.
Figure 8:
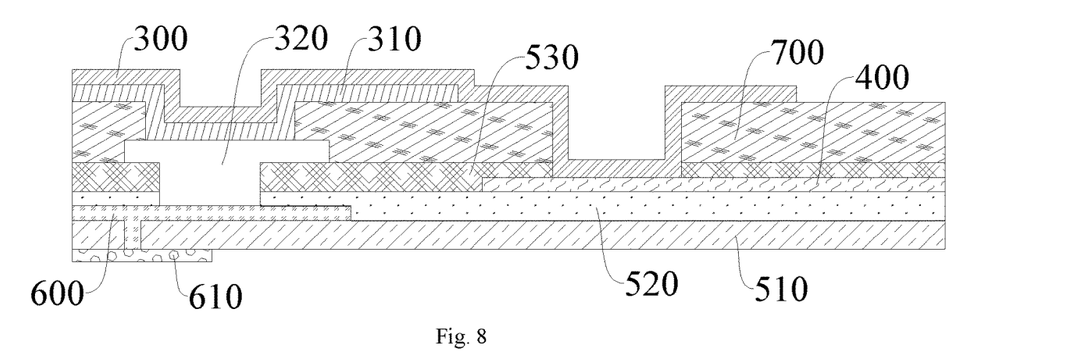
FIG. 8 shows a schematic sectional structural diagram along the line BB of the displaying backplane in FIG. 2.
Figure 9:
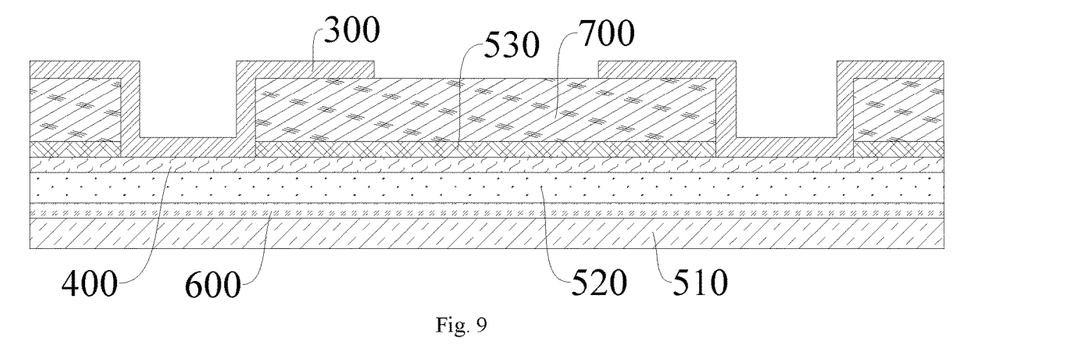
FIG. 9 shows a schematic sectional structural diagram along the line CC of the displaying backplane in FIG. 2.
Figure 10:
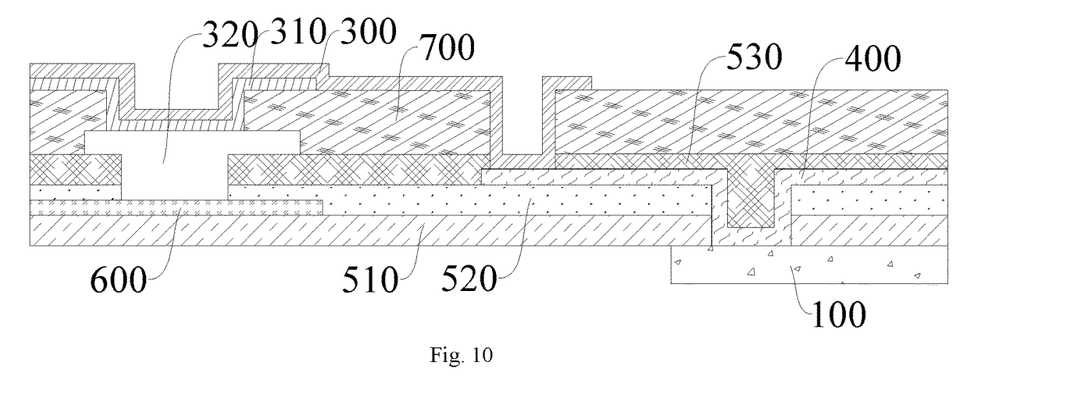
FIG. 10 shows a schematic sectional structural diagram along the line DD of the displaying backplane in FIG. 5.

According to an embodiment of the present disclosure, particularly, the particular mode of configuration of the plurality of electrically conductive traces is not particularly limited. The inventor has found after a large amount of careful investigation and experimental verification that, when the plurality of electrically conductive traces have the following particular mode of configuration, the effect of displaying of the displaying backplane 10 can be further enhanced, with a better stability:

Firstly, referring to FIGS. 4, 5 and 6, it can be understood that, in the displaying backplane 10 according to the present disclosure, the common cathode 200 and the electrically conductive traces 410 have connection points 55a therebetween, the independent cathodes 300 and the electrically conductive traces 410 have connection points 55b therebetween, and the metal signal line 100 and the electrically conductive traces 410 have connection points 55c therebetween. In addition, the "plurality of electrically conductive traces 410", as used herein, should be comprehended broadly. Because, in the displaying backplane 10, the plurality of electrically conductive traces 410 are connected to the common cathode 200, and the independent cathodes 300 are connected to the metal signal line 100 via the first electrically conductive layer 400 having the plurality of electrically conductive traces 410, then, the electrically conductive traces between each of the connection points 55a on the common cathode 200 and each of the connection points that are not on the independent cathodes 300 (for example, the connection points 55c on the metal signal line 100, or another connection point 55a on the common cathode 200) should be deemed as one electrically conductive trace 410. For example, the electrically conductive traces in the dotted-line block in FIG. 4 may be deemed as one electrically conductive trace 410, wherein both of the two connection points 55a at the two ends of that electrically conductive trace are located on the common cathode 200; in other words, both of the two ends of that electrically conductive trace 410 are connected to the common cathode 200. As another example, the electrically conductive traces in the dotted-line block in FIG. 5 may be deemed as one electrically conductive trace 410, wherein the connection point 55a at one end of that electrically conductive trace is located on the common cathode 200, and the connection point 55c at the other end is located on the metal signal line 100; in other words, one end of that electrically conductive trace 410 is connected to the common cathode 200, and the other end is connected to the metal signal line 100.

According to an embodiment of the present disclosure, particularly, the plurality of electrically conductive traces may have the following particular modes of configuration. In some embodiments of the present disclosure, referring to FIG. 4, the plurality of electrically conductive traces 410 may be parallel to each other and have a direction of extension parallel to the direction of extension of the metal signal line 100. In some other embodiments of the present disclosure, referring to FIG. 5, the plurality of electrically conductive traces 410 may be parallel to each other and have a direction of extension perpendicular to the direction of extension of the metal signal line 100. In some other embodiments of the present disclosure, referring to FIG. 6, the plurality of electrically conductive traces may be arranged in a first direction and a second direction, the first direction and the second direction have an included angle therebetween, the first direction is the direction of extension of the metal signal line 100, each of the electrically conductive traces 410 extending in the second direction has one end connected to the metal signal line 100, and one other end connected to the common cathode 200, and both of the two ends of each of the electrically conductive traces 410 extending in the first direction are connected to the common cathode 200 (it can be understood that, as stated above, the electrically conductive traces located in the same one dotted-line block in FIG. 6 are deemed as the same one electrically conductive trace). Accordingly, the above mode of configuration of the plurality of electrically conductive traces has a simple structure and is easily implementable, and can enable the independent cathodes 300 to receive the electric-current signal of the metal signal line 100 more stably, with a lower voltage drop, thereby enabling the effect of displaying of the displaying backplane 10 to be further enhanced, with a better stability.

According to an embodiment of the present disclosure, furthermore, the particular connection mode between the first electrically conductive layer 400 and the independent cathodes 300 and the metal signal line 100 is not particularly limited. Particularly, in some embodiments of the present disclosure, the first electrically conductive layer 400 and the independent cathodes 300 and the metal signal line 100 may be connected by a via hole (referring to FIGS. 7, 8, 9, 10 and 11). In the structures shown in the above figures, it can be clearly seen that the connections between the first electrically conductive layer 400 and the independent cathodes 300 and the metal signal line 100 have via holes (not marked in the figures). Certainly, in some other embodiments of the present disclosure, the first electrically conductive layer 400 and the independent cathodes 300 and the metal signal line 100 may also be connected by a groove, which is not discussed here in further detail. Accordingly, the present embodiment has a simple structure and is easily implementable, and, by using the above mode of configuration, the electric connection between the first electrically conductive layer 400 and the independent cathodes 300 and the metal signal line 100 can be stable, which further enables the electric-current signals of the independent cathodes 300 to be more stable, with a more stable effect of displaying.

According to an embodiment of the present disclosure, optionally, the via hole or the groove may be formed in the insulating layer. Referring to FIGS. 7, 8, 9, 10 and 11, the displaying backplane may further comprise: a first insulating layer 510, wherein the first insulating layer 510 is provided on one side of the substrate base plate (not shown in the figures) in the displaying backplane 10; and a light-emission controlling layer 600, wherein the light-emission controlling layer 600 is electrically connected to an anode 320 of a light emitting diode in the displaying backplane and a source-drain electrode 610 of a thin-film transistor for controlling light emission in the displaying backplane, and the light-emission controlling layer 600 is provided on part of the surface of the first insulating layer 510. The displaying backplane further comprises a second insulating layer 520, wherein the second insulating layer 520 is provided on the surfaces of the light-emission controlling layer 600 and the first insulating layer 510 that are further away from the substrate base plate; and the first electrically conductive layer 400 is provided on one surface of the second insulating layer 520 that is further away from the substrate base plate. Accordingly, the present embodiment has a simple structure and can be easily industrialized.

According to an embodiment of the present disclosure, in addition, it can be understood that the positions of the light-emission controlling layer and the first electrically conductive layer are exchangeable, as long as the mode of the electric connection is not changed, and the first electrically conductive layer is connected to the independent cathodes and the metal signal line by the via hole or the groove. Furthermore, the light-emission controlling layer is merely required to be electrically connected to an anode of a light emitting diode in the displaying backplane and a source-drain electrode of a thin-film transistor for controlling light emission in the displaying backplane. In other words, in some other embodiments of the present disclosure, the first electrically conductive layer may also be provided on part of the surface of the first insulating layer. The displaying backplane further comprises a second insulating layer, wherein the second insulating layer is provided on the surfaces of the first electrically conductive layer and the first insulating layer that are further away from the substrate base plate; and the light-emission controlling layer is provided on one surface of the second insulating layer that is further away from the substrate base plate, which can similarly realize the effect that the electric-current signals of the independent cathodes 300 are more stable, with a more stable effect of displaying. The present embodiment has a simple structure and can be easily industrialized, which is not discussed here in further detail.

According to an embodiment of the present disclosure, optionally, the displaying backplane may further comprise: a second electrically conductive layer, wherein the second electrically conductive layer is provided on one side of the first electrically conductive layer that is further away from the substrate base plate, and the second electrically conductive layer is connected to the independent cathodes and the metal signal line. Accordingly, by providing the two electrically conductive layers, the electric connection between the first electrically conductive layer 400 and the independent cathodes 300 and the metal signal line 100 can be more stable, with a lower voltage drop of the independent cathodes 300, which further enables the electric-current signals of the independent cathodes 300 to be more stable, with a better effect of displaying.

Figure 11:
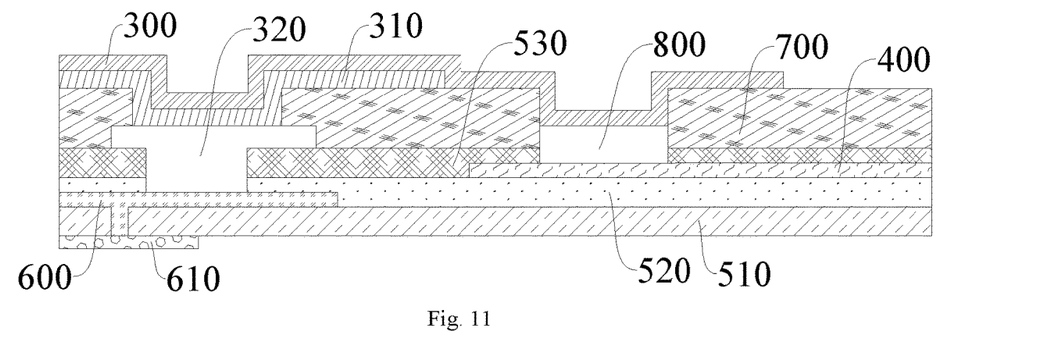
FIG. 11 shows another schematic sectional structural diagram along the line BB of the displaying backplane in FIG. 2.

In some other embodiments of the present disclosure, referring to FIG. 11, the displaying backplane may further comprise: a connecting metal 800, wherein the connecting metal 800 and the anode 320 of the light emitting diode are provided in a same one layer, and the connecting metal 800 is connected to the first electrically conductive layer 400 and the independent cathodes 300. By using the above mode of configuration of the connecting metal 800, the electric connection between the first electrically conductive layer 400 and the independent cathodes 300 can be more stable, with a lower voltage drop of the independent cathodes 300, which further enables the electric-current signals of the independent cathodes 300 to be more stable, with a better effect of displaying.

In a particular embodiment of the present disclosure, the metal signal line may be a VSS signal line. Accordingly, because the independent cathodes 300 in the displaying backplane 10 are connected to the VSS signal line via the first electrically conductive layer 400, when the first electrically conductive layer 400 is a planar electrode, the VSS signal can directly flow into the independent cathodes 300 via the planar electrode, and when the first electrically conductive layer has a plurality of electrically conductive traces 410, the signal of the metal signal line 10 cannot only directly flow into the independent cathodes 300 (referring to FIG. 5 or 6), but can also flow into the independent cathodes 300 via the common cathode 200 (referring to FIG. 4). In those three modes of the VSS signal of the metal signal line 100 flowing into the independent cathodes 300, the electric-current signal does not require to flow through a large load, which can enable the independent cathodes 300 within the second displaying region to have a low voltage drop, to obtain a good effect of displaying.

According to an embodiment of the present disclosure, a person skilled in the art can understand that the displaying backplane, besides the components stated above, may further comprise conventional components of displaying backplanes in the related art, for example, a pixel defining layer 700, a thin-film-transistor-array layer, a light shielding layer and so on, which is not discussed here in further detail. In addition, in the present disclosure, the mode of configuration of the common cathode 200 may be the same as the modes of configuration of cathodes of light emitting diodes in conventional displaying backplanes, which is not discussed here in further detail.

Figure 12:
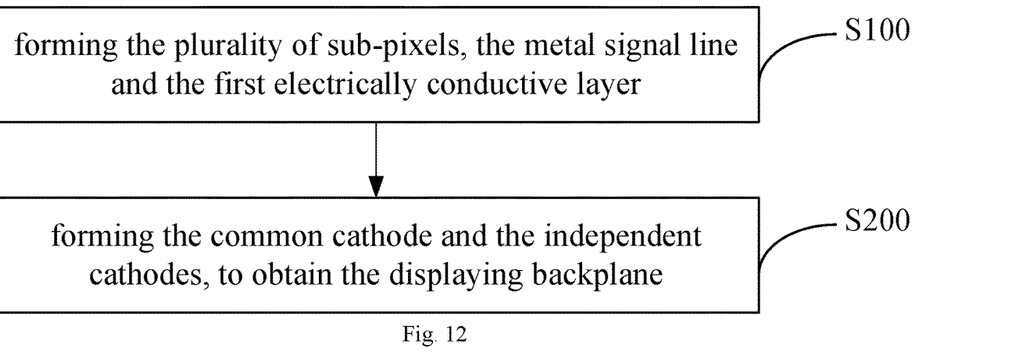
FIG. 12 shows a schematic flow chart of the method for fabricating the displaying backplane according to an embodiment of the present disclosure.

In another aspect of the present disclosure, the present disclosure provides a method for fabricating the displaying backplane stated above. According to an embodiment of the present disclosure, referring to FIG. 12, the method may comprise the following steps:

S100: forming the plurality of sub-pixels, the metal signal line and the first electrically conductive layer.

According to an embodiment of the present disclosure, it can be understood that the particular processes of the formation of the plurality of sub-pixels, the metal signal line and the first electrically conductive layer may be conventional particular processes in the related art for the formation of a plurality of sub-pixels, a metal signal line and an electrically conductive layer, and the processing steps, conditions and parameters may be the same as conventional processing steps, conditions and parameters in the related art, which is not discussed here in further detail. Accordingly, the present embodiment has a simple and convenient operation, is easily implementable, and can be easily industrialized.

S200: forming the common cathode and the independent cathodes, and connecting the independent cathodes to the metal signal line via the first electrically conductive layer, to obtain the displaying backplane, wherein the first electrically conductive layer is a planar electrode, and the orthographic projection of the planar electrode on the substrate base plate covers the second displaying region; or the first electrically conductive layer has a plurality of electrically conductive traces, and the plurality of electrically conductive traces are connected to the common cathode.

According to an embodiment of the present disclosure, it can be understood that the particular processes of the formation of the common cathode and the independent cathodes may be conventional particular processes in the related art for cathodes, for example a vapor deposition process, and the processing steps, conditions and parameters may be the same as conventional processing steps, conditions and parameters in the related art, which is not discussed here in further detail. Accordingly, the present embodiment has a simple and convenient operation, is easily implementable, and can be easily industrialized.

Figure 13:
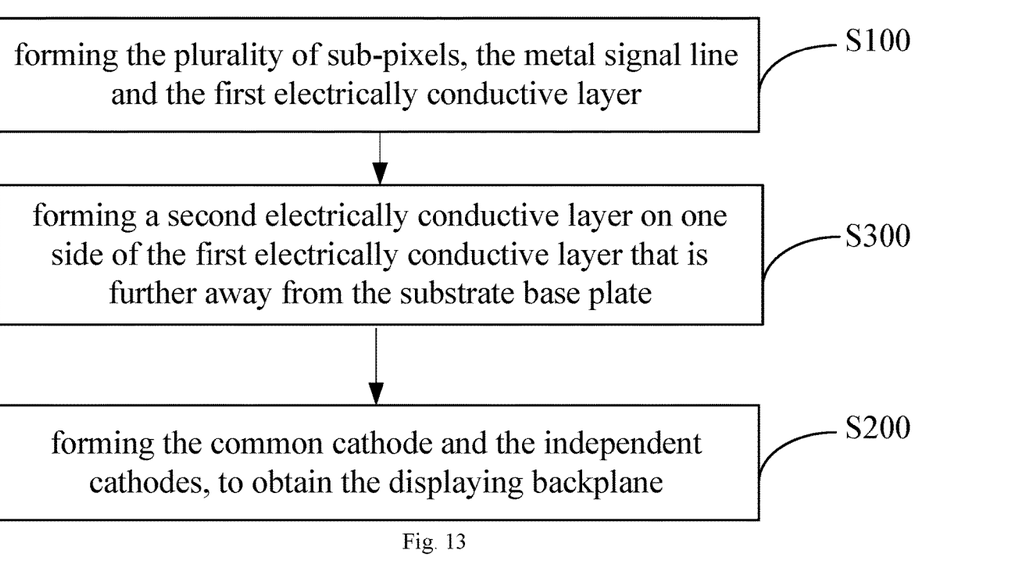
FIG. 13 shows a schematic flow chart of the method for fabricating the displaying backplane according to another embodiment of the present disclosure.

In some other embodiments of the present disclosure, referring to FIG. 13, before the step of forming the common cathode and the independent cathodes, the method may further comprise the following steps:

S300: forming a second electrically conductive layer on one side of the first electrically conductive layer that is further away from the substrate base plate.

According to an embodiment of the present disclosure, it can be understood that the particular process of the formation of the second electrically conductive layer on the one side of the first electrically conductive layer that is further away from the substrate base plate may be conventional particular processes in the related art of electrically conductive layers, and the processing steps, conditions and parameters may be the same as conventional processing steps, conditions and parameters in the related art, which is not discussed here in further detail. Accordingly, the present embodiment has a simple and convenient operation, is easily implementable, and can be easily industrialized.

In yet another aspect of the present disclosure, the present disclosure provides a displaying device. According to an embodiment of the present disclosure, the displaying device comprises the displaying backplane stated above. The displaying device can realize the function of displaying, and, at the same time, can also realize the function of image acquisition, whereby it can realize full-screen displaying. Furthermore, the independent cathodes within the second displaying region have a low voltage drop, to obtain a good effect of displaying. Moreover, the displaying device has all of the characteristics and the advantages of the displaying backplane stated above, which is not discussed here in further detail.

According to an embodiment of the present disclosure, the displaying device, besides the displaying backplane stated above, may further comprise other necessary components and parts, which can be supplemented and designed by a person skilled in the art according to the particular type and the operation requirements of the displaying device, and are not discussed here in further detail.

According to an embodiment of the present disclosure, the particular type of the displaying device is not particularly limited, and, for example, includes but is not limited to a mobile phone, a tablet personal computer, a wearable device, a game machine, a television set or an onboard display and so on.

In the description of the present disclosure, it should be understood that the terms "first" and "second" are merely for the purpose of describing, and should not be construed as indicating or implying the degrees of importance or implicitly indicating the quantity of the specified technical features. Accordingly, the features defined by "first" or "second" may explicitly or implicitly comprise one or more of the features. In the description of the present disclosure, the meaning of "plurality of" is "two or more", unless explicitly and clearly defined otherwise.

In the present disclosure, unless explicitly defined or limited otherwise, the terms "mount", "connect", "link" and "fix" should be interpreted broadly. For example, it may be fixed connection, detachable connection, or integral connection; it may be mechanical connection or electric connection; and it may be direct connection or indirect connection by an intermediate medium, and may be the internal communication between two elements or the interaction between two elements. A person skilled in the art can determine the particular meaning of the terms in the present disclosure concretely.

In the description of the present disclosure, the description referring to the terms "an embodiment", "some embodiments", "example", "particular example" or "some examples" and so on means that particular features, structures, materials or characteristics described with reference to the embodiment or example are comprised in at least one of the embodiments or examples of the present disclosure. In the description, the illustrative expressions of the above terms do not necessarily relate to the same embodiment or example. Furthermore, the described particular features, structures, materials or characteristics may be combined in one or more embodiments or examples in a suitable form. Furthermore, subject to avoiding contradiction, a person skilled in the art may combine different embodiments or examples described in the description and the features of the different embodiments or examples.

Although the embodiments of the present disclosure have already been illustrated and described above, it can be understood that the above embodiments are illustrative, and should not be construed as a limitation on the present disclosure, and a person skilled in the art may make variations, modifications, substitutions and improvements to the above embodiments within the scope of the present disclosure.

The invention claimed is:

1. A displaying backplane, a displaying region of the displaying backplane being delimited into a first displaying region and a second displaying region, a light transmittance of the first displaying region being less than a light transmittance of the second displaying region, and the displaying backplane having a metal signal line in a trace region, wherein a plurality of sub-pixels located within the first displaying region are connected to a common cathode, and the common cathode is connected to the metal signal line;

at least some of the plurality of sub-pixels located within the second displaying region are connected to independent cathodes, a plurality of the independent cathodes within the second displaying region are separate from each other, the displaying backplane further comprises a first electrically conductive layer, and the independent cathodes are connected to the metal signal line via the first electrically conductive layer; and the first electrically conductive layer is a planar electrode, and an orthographic projection of the planar electrode on a substrate base plate covers the second displaying region; or the first electrically conductive layer has a plurality of electrically conductive traces, and the plurality of electrically conductive traces are connected to the common cathode.

2. The displaying backplane according to claim 1, wherein the planar electrode is connected to the common cathode.

3. The displaying backplane according to claim 1, wherein the displaying backplane further comprises: a connecting metal, wherein the connecting metal and an anode of a light emitting diode of the displaying backplane are provided in a same one layer, and the connecting metal is connected to the first electrically conductive layer and the independent cathodes.

4. The displaying backplane according to claim 1, wherein the plurality of electrically conductive traces are provided parallel to each other and have a direction of extension parallel to a direction of extension of the metal signal line.

5. The displaying backplane according to claim 1, wherein the plurality of electrically conductive traces are provided parallel to each other and have a direction of extension perpendicular to a direction of extension of the metal signal line.

6. The displaying backplane according to claim 1, wherein the plurality of electrically conductive traces are arranged in a first direction and a second direction, the first direction and the second direction have an included angle therebetween, the first direction is a direction of extension of the metal signal line, each of the electrically conductive traces extending in the second direction has one end connected to the metal signal line, and an other end connected to the common cathode, and both of two ends of each of the electrically conductive traces extending in the first direction are connected to the common cathode.

7. The displaying backplane according to claim 1, wherein the displaying backplane further comprises: a second electrically conductive layer, wherein the second electrically conductive layer is provided on one side of the first electrically conductive layer that is further away from the substrate base plate, and the second electrically conductive layer is connected to the independent cathodes and the metal signal line.

8. The displaying backplane according to claim 1, wherein the metal signal line is a VSS signal line.

9. The displaying backplane according to claim 1, wherein the first electrically conductive layer is connected to the independent cathodes and the metal signal line by at least one of a via hole and a groove.

10. The displaying backplane according to claim 9, wherein the via hole and the groove are formed in an insulating layer.

11. The displaying backplane according to claim 1, wherein the displaying backplane further comprises:
a first insulating layer, wherein the first insulating layer is provided on one side of the substrate base plate; and
a light-emission controlling layer, wherein the light-emission controlling layer is electrically connected to an anode of a light emitting diode in the displaying backplane and a source-drain electrode of a thin-film transistor for controlling light emission in the displaying backplane, and the light-emission controlling layer is provided on part of a surface of the first insulating layer.

12. The displaying backplane according to claim 11, wherein the displaying backplane further comprises:
a second insulating layer, wherein the second insulating layer is provided on surfaces of the light-emission controlling layer and the first insulating layer that are further away from the substrate base plate; and
the first electrically conductive layer is provided on one surface of the second insulating layer that is further away from the substrate base plate.

13. A method for fabricating the displaying backplane according to claim 1, wherein the method comprises:
forming the plurality of sub-pixels, the metal signal line and the first electrically conductive layer; and
forming the common cathode and the independent cathodes, to obtain the displaying backplane.

14. The method according to claim 13, wherein before the step of forming the common cathode and the independent cathodes, the method further comprises:
forming a second electrically conductive layer on one side of the first electrically conductive layer that is further away from the substrate base plate.

15. A displaying device, wherein the displaying device comprises the displaying backplane according to claim 1.

* * * * *